(12) United States Patent
Suo et al.

(10) Patent No.: US 11,854,886 B2
(45) Date of Patent: Dec. 26, 2023

(54) METHODS OF TSV FORMATION FOR ADVANCED PACKAGING

(71) Applicant: Applied Materials, Inc., Santa Clara, CA (US)

(72) Inventors: Peng Suo, Singapore (SG); Ying W. Wang, Singapore (SG); Guan Huei See, Singapore (SG); Chang Bum Yong, Singapore (SG); Arvind Sundarrajan, Singapore (SG)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/847,419

(22) Filed: Jun. 23, 2022

(65) Prior Publication Data

US 2022/0328354 A1    Oct. 13, 2022

Related U.S. Application Data

(63) Continuation of application No. 16/953,869, filed on Nov. 20, 2020, now Pat. No. 11,404,318.

(51) Int. Cl.
| | |
|---|---|
| *H01L 21/768* | (2006.01) |
| *H01L 21/308* | (2006.01) |
| *H01L 21/288* | (2006.01) |
| *H01L 21/285* | (2006.01) |
| *H01L 21/306* | (2006.01) |

(52) U.S. Cl.
CPC ...... *H01L 21/76898* (2013.01); *H01L 21/288* (2013.01); *H01L 21/2855* (2013.01); *H01L 21/308* (2013.01); *H01L 21/30625* (2013.01)

(58) Field of Classification Search
CPC .......... H01L 21/76898; H01L 21/2855; H01L 21/288; H01L 21/30625; H01L 21/308
USPC ........................................................ 438/667
See application file for complete search history.

(56) References Cited

U.S. PATENT DOCUMENTS

| | | | |
|---|---|---|---|
| 2002/0074615 A1* | 6/2002 | Honda ................ | G01F 1/6845 257/E21.597 |
| 2013/0074332 A1* | 3/2013 | Suzuki ................. | H05K 1/185 29/834 |
| 2013/0341738 A1* | 12/2013 | Reinmuth .......... | B81C 1/00134 257/415 |
| 2016/0276325 A1* | 9/2016 | Nair ...................... | H01L 21/568 |

* cited by examiner

*Primary Examiner* — Quoc D Hoang
(74) *Attorney, Agent, or Firm* — Patterson + Sheridan, LLP (57) ABSTRACT

The present disclosure relates to through-via structures with dielectric shielding of interconnections for advanced wafer level semiconductor packaging. The methods described herein enable the formation of high thickness dielectric shielding layers within low aspect ratio through-via structures, thus facilitating thin and small-form-factor package structures having high I/O density with improved bandwidth and power.

6 Claims, 12 Drawing Sheets

METHODS OF TSV FORMATION FOR ADVANCED PACKAGING

CROSS-REFERENCE TO RELATED APPLICATIONS

This application is a continuation of co-pending U.S. patent application Ser. No. 16/953,869, filed Nov. 20, 2020, which is herein incorporated by reference in its entirety.

BACKGROUND

Field

Embodiments described herein generally relate to shielded through-via structures for advanced wafer level semiconductor packaging and methods of forming the same.

Description of the Related Art

Ongoing trends in the development of semiconductor device technology have led to semiconductor components being integrated into circuits having reduced dimensions and increased densities. In accordance with the demand for continued scaling of semiconductor devices while also improving performance capability and functionality, these integrated circuits are fabricated into complex 3D semiconductor packages that facilitate a significant reduction in overall device footprint and enable shorter and faster connections between components. Such packages may integrate, for example, semiconductor chips and a plurality of other electronic components for mounting onto a circuit board of an electronic device.

Accordingly, the foregoing trends and demand drive a need for improved dielectric shielding of interconnections (i.e., interconnects or interconnect structures), which enable assembly of semiconductor components and integrated circuits into such complex 3D packages. As is known, a vertical interconnect access (or "via") is one example of an interconnect. However, as circuit densities are increased and via dimensions are decreased, dielectric shielding layers formed around vias are also reduced in thickness, largely due to limitations associated with depositing dielectric material within the vias by chemical vapor deposition (CVD) or atomic layer deposition (ALD). The reduced thickness of the dielectric shielding layers may result in increased leakage current, which would in turn reduce the performance capabilities of packaged devices.

Therefore, there is a need in the art for improved methods of forming shielded through-via structures for advanced wafer level semiconductor packaging.

SUMMARY

The present disclosure generally relates to shielded through-via structures for advanced wafer level semiconductor packaging and methods of forming the same.

In certain embodiments, a method of forming a through-silicon via structure is provided. The method includes forming a trench in a first side of a silicon substrate such that the trench surrounds a portion of the silicon substrate, filling the trench with a dielectric material, removing the portion of the silicon substrate surrounded by the trench to expose an inner surface of the dielectric material, plating a conductive material on the inner surface of the dielectric material, and grinding or polishing the silicon substrate on the first side and a second side opposite the first side. The grinding or polishing exposes the conductive material and the dielectric material on the first side and the second side.

In certain embodiments, a method of forming a through-silicon via structure is provided. The method includes forming a trench in a first side of a silicon substrate such that the trench surrounds a portion of the silicon substrate, laminating a dielectric film on the first side of the silicon substrate to cause a dielectric material of the dielectric film to fill the trench, grinding or polishing the first side of the silicon substrate to remove the dielectric film outside of the trench, removing the portion of the silicon substrate surrounded by the trench to form a hole exposing an inner surface of the dielectric material, plating a conductive material on the first side of the silicon substrate such that the conductive material extends through the hole, and grinding or polishing the silicon substrate on the first side and a second side opposite the first side. The grinding or polishing removes the conductive material disposed outside the hole and exposes the conductive material and the dielectric material on the first side and the second side.

In certain embodiments, a method of forming a through-silicon via structure is provided. The method includes forming a trench in a first side of a silicon substrate such that the trench surrounds a portion of the silicon substrate, laminating a dielectric film on the first side of the silicon substrate to cause a dielectric material of the dielectric film to fill the trench, laser drilling a pit into the dielectric film and over the trench such that an outer dimension of the pit is at least about the same or greater than an outer dimension of the portion of the silicon substrate or the trench, removing the portion of the silicon substrate surrounded by the trench to form a hole through the dielectric material in the trench exposing an inner surface of the dielectric material, plating a conductive material on the first side of the silicon substrate and the dielectric film such that the conductive material extends through the hole, and grinding or polishing the silicon substrate on the first side and a second side opposite the first side. The grinding or polishing removes the conductive material disposed outside of the hole and the dielectric film disposed outside of the trench, and further exposes the conductive material and the dielectric material on the first side and the second side.

In certain embodiments, a method of forming a through-silicon via structure is provided. The method includes forming a trench in a first side of a silicon substrate such that the trench surrounds a portion of the silicon substrate, laminating a dielectric film on the first side of the silicon substrate to cause a dielectric material of the dielectric film to fill the trench, laser drilling a pit into the dielectric film and over the portion of the silicon substrate such that the portion is exposed through the dielectric material, removing the portion of the silicon substrate surrounded by the trench to form a hole through the dielectric material in the trench exposing an inner surface of the dielectric material, plating a conductive material on the first side of the silicon substrate and the dielectric film such that the conductive material extends through the hole, and grinding or polishing the silicon substrate on the first side and a second side opposite the first side. The grinding or polishing removes the conductive material disposed outside of the hole and the dielectric film disposed outside of the trench, and further exposes the conductive material and the dielectric material on the first side and the second side.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Embodiments of the present disclosure relate to shielded through-via structures for advanced wafer level semiconductor packaging and methods of forming the same. The ongoing demands for smaller overall sizes and greater densities of advanced package structures drive a need for improved dielectric shielding of interconnections disposed therein. However, as circuit densities are being increased and through-via dimensions are decreased, the deposition of dielectric materials within through-vias and around interconnections becomes increasingly difficult, largely due to limitations associated with deposition of dielectric materials within narrow through-via structures. As a result, thin and suboptimal dielectric shielding layers are formed, which may result in increased leakage current and reduced system performance. The methods described herein provide for improved methods of forming dielectric shielded through-via structures, enabling high thickness dielectric shielding layers while maintaining low aspect ratios of through-via structures.

Figure 1:
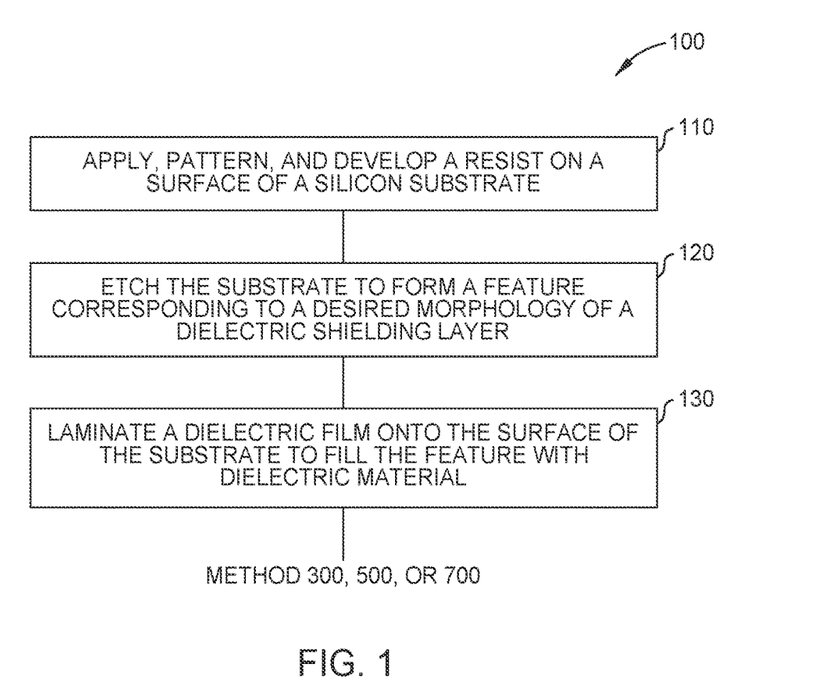
FIG. 1 illustrates a flow diagram of a process for forming a through-silicon via in a substrate, according to embodiments described herein.

FIG. 1 illustrates a flow diagram of a representative method 100 for structuring and thereafter laminating a substrate for formation of a through-silicon via. FIGS. 2A-2E schematically illustrate cross-sectional views of a substrate 200 at different stages of the structuring and lamination process 100 represented in FIG. 1. Therefore, FIG. 1 and FIGS. 2A-2E are herein described together for clarity. Note that although described in relation to the formation of a single through-silicon via, the methods disclosed herein may be utilized to form a plurality or array of through-silicon via simultaneously.

Generally, method 100 begins at operation 110, corresponding to FIG. 2A, wherein a spin-on/spray-on or dry resist film 210, such as a photoresist, is applied to a surface 202 on a topside 205 of substrate 200 and is subsequently patterned and developed. Substrate 200 is formed of any suitable substrate material including but not limited to a III-V compound semiconductor material, silicon (e.g., having a resistivity between about 1 and about 10 Ohm-cm or conductivity of about 100 W/mK), crystalline silicon (e.g., Si<100> or Si<111>), silicon oxide, silicon germanium, doped or undoped silicon, undoped high resistivity silicon (e.g., float zone silicon having lower dissolved oxygen content and a resistivity between about 5000 and about 10000 ohm-cm), doped or undoped polysilicon, silicon nitride, silicon carbide (e.g., having a conductivity of about 500 W/mK), quartz, glass (e.g., borosilicate glass), sapphire, alumina, and/or ceramic materials. In one embodiment, substrate 200 is a monocrystalline p-type or n-type silicon substrate. In one embodiment, substrate 200 is a polycrystalline p-type or n-type silicon substrate. In another embodiment, substrate 200 is a p-type or n-type silicon solar substrate.

Substrate 200 may further have any suitable shape and/or dimensions. For example, substrate 200 may have a polygonal or circular shape. In certain embodiments, substrate 200 includes a substantially square silicon substrate having lateral dimensions between about 120 mm and about 180 mm, such as about 150 mm or between about 156 mm and about 166 mm, with or without chamfered edges. In certain other embodiments, substrate 200 includes a circular silicon-containing wafer having a diameter between about 20 mm and about 700 mm, such as between about 100 mm and about 500 mm, for example about 200 mm or about 300 mm.

Unless otherwise noted, embodiments and examples described herein are conducted on substrates having a thickness between about 50 µm and about 1500 µm, such as between about 90 µm and about 780 µm. For example, substrate 200 has a thickness between about 100 µm and about 300 µm, such as a thickness between about 110 µm and about 200 µm. In another example, substrate 200 has a thickness between about 60 µm and about 160 µm, such as a thickness between about 80 µm and about 120 µm.

In certain embodiments, at operation 110, resist film 210 is patterned via selective exposure to UV radiation and is thereafter developed. In certain embodiments, the development process is a wet process, such as a wet process that includes exposing resist film 210 to a solvent. For example, the development process may be a wet etch process utilizing an aqueous etch process. In other examples, the film development process may be a wet etch process utilizing a buffered etch process selective for a desired material. However, any suitable wet solvents or combination of wet etchants may be used for the resist film development process.

In further embodiments, an adhesion promoter layer (not shown) may be applied to surface 202 of substrate 200 prior to application of resist film 210, to improve adhesion of resist film 210 to substrate 200. For example, the adhesion promoter layer may be formed of bis(trimethylsilyl)amine, hexamethyldisilazane (HMDS), propylene glycol monomethyl ether acetate (PGMEA), or the like.

Figure 2A:
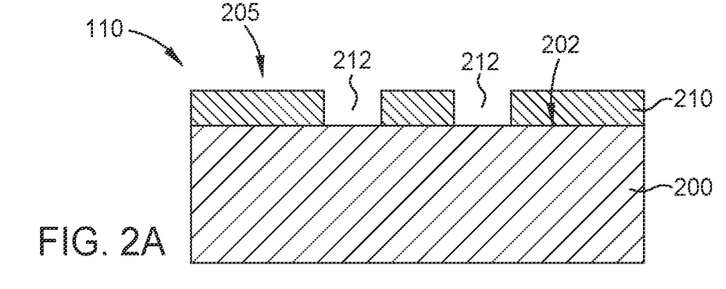
FIGS. 2A-2E schematically illustrate cross-sectional views of a substrate at different stages of the process depicted in FIG. 1.
Figure 2B:
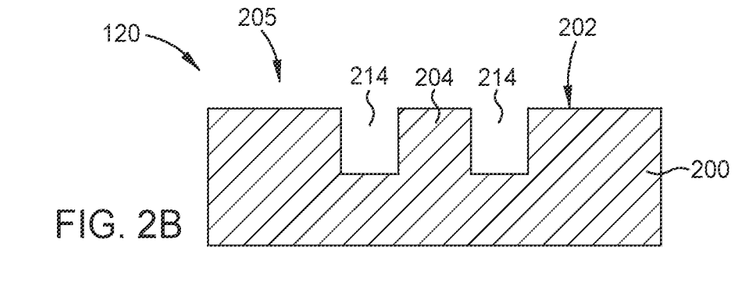

As depicted in FIG. 2A, resist film 210 is patterned and developed according to a desired morphology of a subsequently formed dielectric shielding layer for a through-silicon via (TSV). Generally, the subsequently formed interconnection within the TSV has a cylindrical or round tubular shape, and thus, the surrounding dielectric shielding layer has a round tubular shape. Accordingly, in certain embodiments, resist film 210 is patterned and developed to form an annular trench 212 in resist film 210, enabling the subsequent formation of a round tubular dielectric shielding layer. A top view of an annular trench 212 is depicted in FIG. 2D for reference. In certain other embodiments, however, a non-cylindrical or non-annular interconnection and/or non-annular dielectric shielding layer is desired, and thus, a non-annular trench 212 is formed. For example, trench 212 formed in resist film 210 at operation 110 may be ovate, ellipsoid, or polygonal in shape. A top view of a polygonal trench 212 is depicted in FIG. 2E for reference.

At operation 120, substrate 200, now having patterned and developed resist film 210 formed thereon, is exposed to a silicon etch process to transfer the pattern of resist film 210 to substrate 200, and resist film 210 is thereafter removed. In certain embodiments, the silicon etch process is a wet etch process, including a buffered etch process that is selective for the removal of silicon. In certain embodiments, the etch process is a wet etch process utilizing an isotropic aqueous etch process. Any suitable wet etchant or combination of wet etchants may be used for the wet etch process. For example, in certain embodiments, substrate 200 is immersed in an aqueous HF etching solution or an aqueous KOH etching solution for etching. During the etch process, the etching solution may be heated to a temperature between about 30° C. and about 100° C., such as between about 40° C. and about 90° C., in order to accelerate the etching process. For example, the etching solution is heated to a temperature of about 70° C. during the etch process. In still other embodiments, the etch process at operation 120 is a dry etch process. An example of a dry etch process that may be performed at operation 120 is a plasma-based dry etch process.

As a result of the etch process, portions of substrate 200 exposed through trench 212 (e.g., surface 202) are etched away, forming a feature 214 (e.g., a trench) which substantially corresponds in lateral morphology to trench 212 and thus, the subsequently formed dielectric shielding layer. For example, in certain embodiments, feature 214 may be substantially annular in shape with dimensions (e.g., widths) similar to trench 212. As depicted in FIG. 2B, feature 214 is formed around a portion 204 of substrate 200, which is later etched away to form a through-via. Generally, the depth of feature 214 may be modulated by controlling the time of exposure of substrate 200 to the etchants (e.g., the etching solution) used during the etch process. For example, a final depth of feature 214 may be increased with increased exposure to the etchants. Alternatively, feature 214 may have a decreased (e.g., shallower) final depth with decreased exposure to the etchants.

Figure 2C:
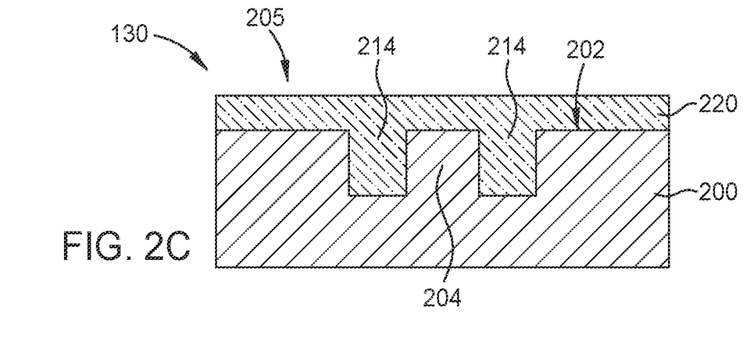
Figure 2D:
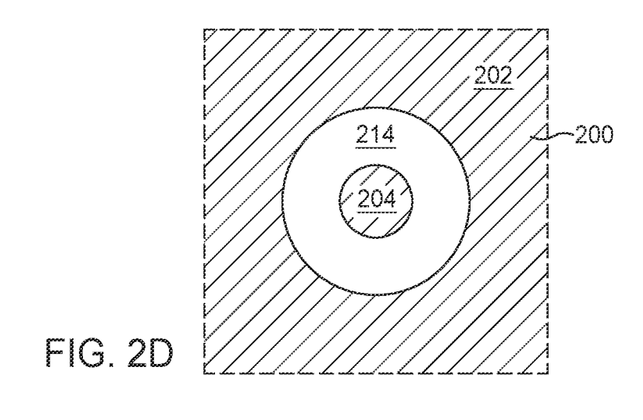
Figure 2E:
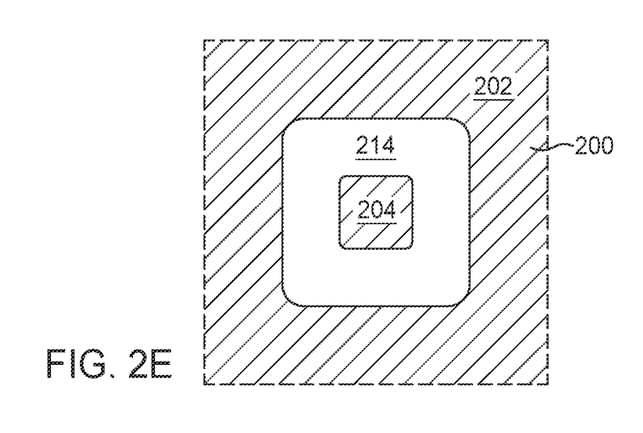

Upon removal of resist film 210, a dielectric film 220 is placed over surface 202 of patterned substrate 200 and laminated to flow into and fill newly-formed feature 214 at operation 130, and as shown in FIG. 2C. During lamination, substrate 200 and dielectric film 220 are exposed to elevated temperatures, causing dielectric film 220 to soften and flow into feature 214. In certain embodiments, the lamination process is a vacuum lamination process that may be performed in a laminator or other suitable device. In certain embodiments, the lamination process is performed by use of a hot pressing process.

In one embodiment, the lamination process is performed at a temperature of between about 80° C. and about 200° C. and for a period between about 5 seconds and about 90 seconds, such as between about 30 seconds and about 60 seconds. In some embodiments, the lamination process includes the application of a pressure of between about 1 psig and about 50 psig while substrate 200 and dielectric film 220 are exposed to a temperature between about 80° C. and about 140° C. for a period between about 5 seconds and about 90 seconds. For example, the lamination process is performed at a pressure of between about 5 psig and about 40 psig and a temperature of between about 100° C. and about 120° C. for a period between about 10 seconds and about 1 minute. For example, the lamination process is performed at a temperature of about 110° C. for a period of about 20 seconds.

Generally, dielectric film 220 is formed of an epoxy resin. For example, dielectric film 220 may be formed of a ceramic-filler-containing epoxy resin, such as an epoxy resin filled with (e.g., containing) substantially spherical silica ($SiO_2$) particles. As used herein, the term "spherical" refers to any round, ellipsoid, or spheroid shape. For example, in some embodiments, the ceramic fillers may have an elliptic shape, an oblong oval shape, or other similar round shape. However, other morphologies are also contemplated. Other examples of ceramic fillers that may be utilized to form dielectric film 220 include aluminum nitride (AlN), aluminum oxide ($Al_2O_3$), silicon carbide (SiC), silicon nitride ($Si_3N_4$), $Sr_2Ce_2Ti_5O_{16}$ ceramics, zirconium silicate ($ZrSiO_4$), wollastonite ($CaSiO_3$), beryllium oxide (BeO), cerium dioxide ($CeO_2$), boron nitride (BN), calcium copper titanium oxide ($CaCu_3Ti_4O_{12}$), magnesium oxide (MgO), titanium dioxide ($TiO_2$), zinc oxide (ZnO) and the like.

In some examples, the ceramic fillers utilized to form dielectric film 220 have particles ranging in size between about 40 nm and about 1.5 μm, such as between about 80 nm and about 1 μm. For example, the ceramic fillers utilized to form dielectric film 220 have particles ranging in size between about 200 nm and about 800 nm, such as between about 300 nm and about 600 nm. In some embodiments, the ceramic fillers include particles having a size less than about 25% of a width or diameter of feature 214 formed in substrate 200, such as less than about 15% of a desired feature's width or diameter.

After lamination of dielectric film 220, a shielded through-silicon via may be formed in substrate 200 utilizing the methods described below with reference to FIGS. 3 and 4A-4E, FIGS. 5 and 6A-6E, or, alternatively, FIGS. 7 and 8A-8D.

Figure 3:
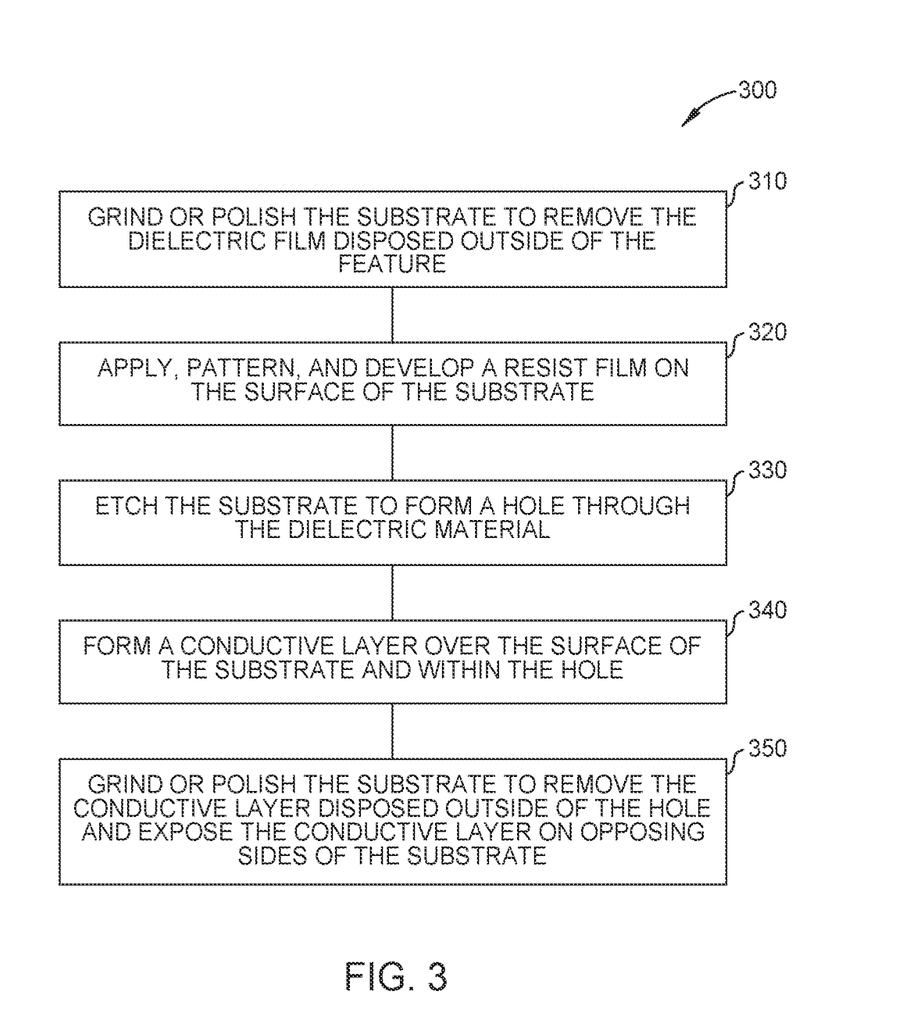
FIG. 3 illustrates a flow diagram of a process for forming a through-silicon via in a substrate, according to embodiments described herein.

FIG. 3 illustrates a flow diagram of a first representative method 300 for forming a through-silicon via in structured and laminated substrate 200 described above. FIGS. 4A-4E schematically illustrate cross-sectional views of substrate 200 at different stages of through-silicon via formation process 300 represented in FIG. 3. Therefore, FIG. 3 and FIGS. 4A-4E are herein described together for clarity.

Figure 4A:
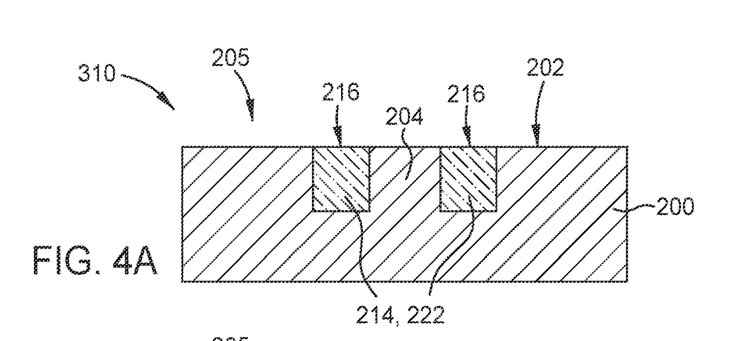
FIGS. 4A-4E schematically illustrate cross-sectional views of a substrate at different stages of the process depicted in FIG. 3.

At operation 310 and FIG. 4A, topside 205 of substrate 200, having dielectric film 220 laminated thereon, is exposed to a grinding or polishing process to remove a portion of dielectric film 220 disposed outside of feature 214. In certain embodiments, substrate 200 is exposed to a chemical mechanical polishing (CMP) process using a polishing slurry with abrasive particles. Generally, the grinding or polishing process at operation 310 removes only dielectric film 220 disposed outside of feature 214 and stops at surface 202 of substrate 200, resulting in a dielectric shielding layer 222 within feature 214 having a top surface 216 that is planar with surface 202. However, in certain embodiments, the grinding or polishing process at operation 310 may also remove a portion of substrate 200 to reduce a thickness thereof as desired (e.g., thin the substrate 200).

Figure 4B:
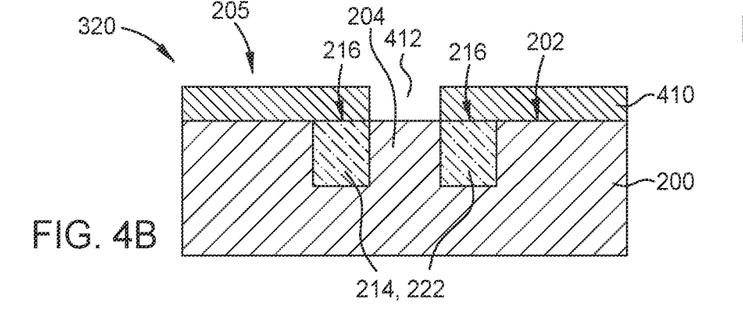

After grinding or polishing, a resist film 410 is applied to surface 202 of substrate 200 and is subsequently patterned and developed at operation 320. Resist film 410 may be substantially similar to resist film 210, and may be patterned via selective exposure to UV radiation and thereafter developed via a wet process. In further embodiments, an adhesion promoter layer (not shown) may be applied to surface 202 of substrate 200 prior to application of resist film 410, such as an adhesion promoter layer formed of bis(trimethylsilyl) amine, hexamethyldisilazane (HMDS), propylene glycol monomethyl ether acetate (PGMEA), or the like.

As depicted in FIG. 4B, resist film 410 is patterned and developed to form a trench 412 that exposes surface 202 over portion 204, which is surrounded by dielectric shielding layer 222. Accordingly, the lateral dimensions (e.g., width) of patterned trench 412 correspond to the lateral dimensions of portion 204, ranging between about 10 μm and about 50 μm, such as between about 20 μm and about 40 μm.

Figure 4C:
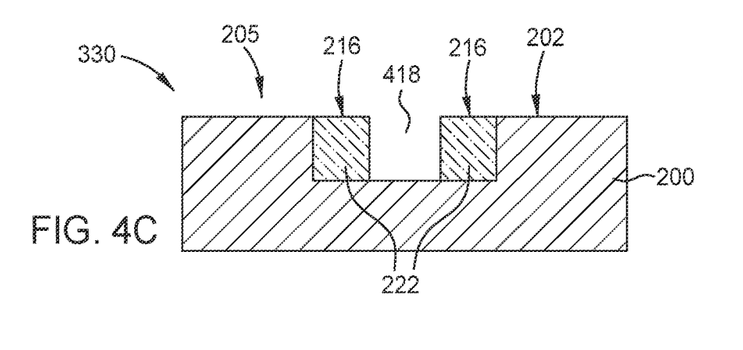

At operation 330 and FIG. 4C, substrate 200 is exposed to a second silicon etch process to form a hole 418 within dielectric shielding layer 222, and resist film 410 is thereafter removed. In certain embodiments, the silicon etch process at operation 330 is substantially similar to the etch process at operation 120. For example, the etch process may be a wet etch process, including a buffered etch process that is selective for the removal of silicon, or an isotropic aqueous etch process. As a result of the silicon etch process, portion 204 of substrate 200 is etched away, forming hole 418 within (e.g., surrounded by) dielectric shielding layer 222 for subsequent plating of conductive material (e.g., an interconnection). As described above, hole 418 may have any desired morphology, such as a cylindrical or polygonal morphology. In certain examples, however, hole 418 is ovate or ellipsoid in morphology.

Figure 4D:
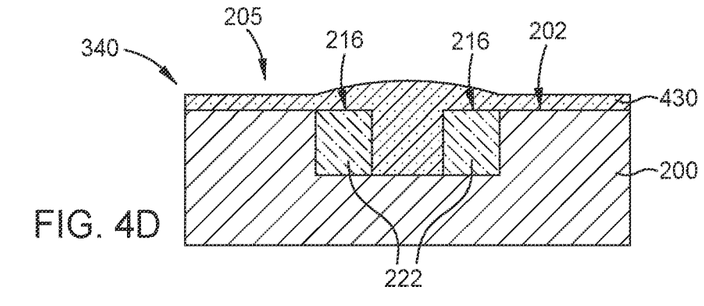

At operation 340 and FIG. 4D, a conductive layer 430 is formed over exposed surfaces of dielectric shielding layer 222 and over surface 202 of substrate 200. As shown in FIG. 4D, conductive layer 430 extends over surface 202, surface 216, and surfaces of dielectric shielding layer 222 surrounding hole 418, which will subsequently function as an interconnect through substrate 200. Conductive layer 430 is deposited over substrate 200 by any suitable methods including electroless deposition or a combination of physical vapor deposition (PVD) and electrochemical deposition (ECD). In certain embodiments, conductive layer 430 is deposited to fill or "plug" hole 418, thus creating a solid or filled conductive body within hole 418. In certain other embodiments, however, conductive layer 430 is deposited to only line surfaces of dielectric shielding layer 222 around hole 418. In such embodiments, a thickness of conductive layer 430 is between about 5 μm and about 20 μm, such as between about 10 μm and about 15 μm.

Conductive layer 430 is generally formed of one or more layers of any suitable conductive material, including but not limited to copper, aluminum, gold, nickel, silver, palladium, tin, or the like. In further embodiments, an adhesion layer (not shown) and/or a seed layer (not shown) are formed over the surfaces of substrate 200 and dielectric shielding layer 222 prior to deposition of conductive layer 430. For example, in certain embodiments, a molybdenum, titanium, tantalum, or titanium-tungsten adhesion layer and/or a copper seed layer are deposited over substrate 200 and dielectric shielding layer 222 prior to deposition of conductive layer 430 to improve adhesion thereof and block diffusion of conductive materials.

Figure 4E:
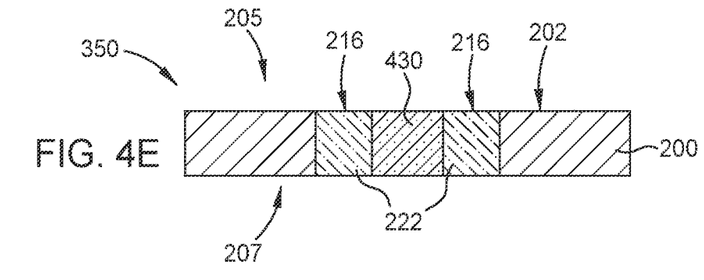

After deposition of conductive layer 430, a second grinding or polishing process (e.g., CMP) is performed on substrate 200 at operation 350 and FIG. 4E to remove at least a portion of conductive layer 430 disposed outside of hole 418, as well as a portion of substrate 200 on a backside 207 thereof. Similar to the grinding or polishing process at operation 310, the grinding or polishing on topside 205 may stop at surface 202 of substrate 200. The grinding or polishing on backside 207, however, is carried out until dielectric shielding layer 222 and conductive layer 430 formed therein are exposed on backside 207, resulting in a through-silicon via 440 having conductive layer 430 (e.g., interconnection) shielded by dielectric shielding layer 222.

Figure 5:
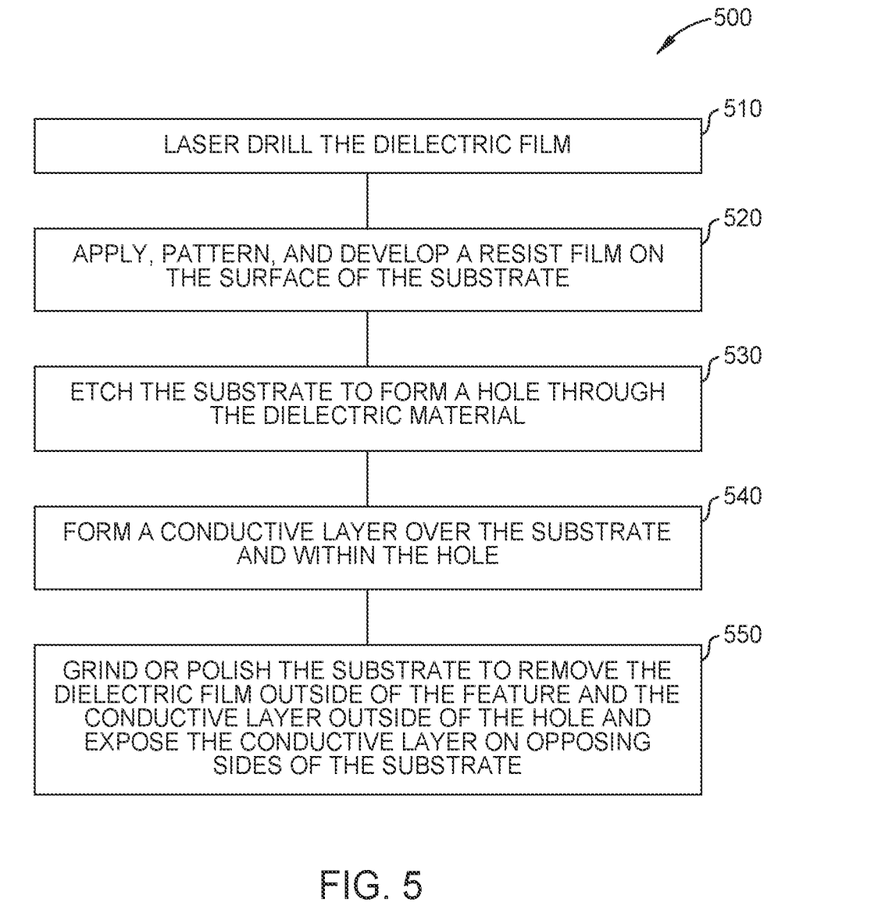
FIG. 5 illustrates a flow diagram of a process for forming a through-silicon via in a substrate, according to embodiments described herein.

FIG. 5 illustrates a flow diagram of an alternative method 500 for forming a through-silicon via in substrate 200 upon performing method 100 described above. FIGS. 6A-6E schematically illustrate cross-sectional views of substrate 200 at different stages of through-silicon via formation process 500 represented in FIG. 5. Therefore, FIG. 5 and FIGS. 6A-6E are herein described together for clarity.

Figure 6A:
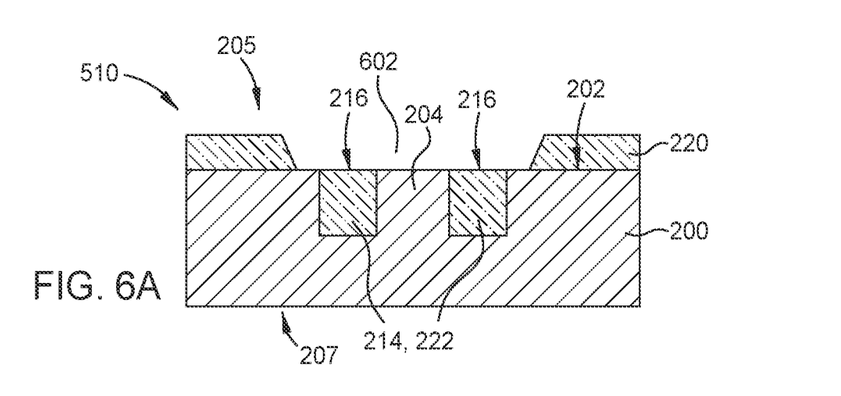
FIGS. 6A-6E schematically illustrate cross-sectional views of a substrate at different stages of the process depicted in FIG. 5.

At operation 510 and FIG. 6A, only an area of laminated dielectric film 220 above feature 214 is removed from substrate 200 by laser ablation, thus separating dielectric shielding layer 222 disposed within feature 214 from the rest of dielectric film 220 and forming top surface 216 of dielectric shielding layer 222. The laser ablation of dielectric film 220 further creates a pit 602 above feature 214 having outer lateral dimensions at least about the same or greater than portion 204 or feature 214. The laser system utilized to ablate or drill dielectric film 220 at operation 510 may include any suitable type of laser source, such as an infrared (IR) laser, a picosecond UV, a femtosecond UV laser, or a femtosecond green laser, and may produce a continuous and/or pulsed laser beam.

Figure 6B:
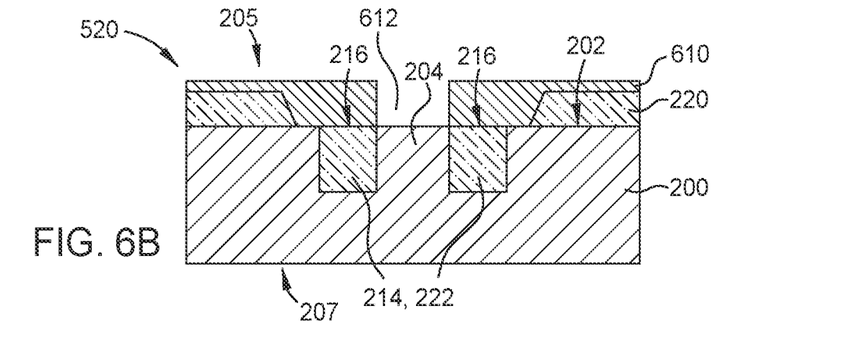

After laser ablation, a resist film 610 is placed over topside 205 of substrate 200 and is subsequently patterned and developed at operation 520. Resist film 610 may be substantially similar to resist films 210 and 410, and may be patterned via selective exposure to UV radiation and thereafter developed via a wet process. In further embodiments, an adhesion promoter layer (not shown) may be utilized to promote adhesion of resist film 610 onto dielectric film 220 and/or substrate 200.

As depicted in FIG. 6B, resist film 610 is applied over dielectric film 220 and within pit 602 prior to patterning and development. Patterning and/or development of resist film 610 forms a trench 612 that exposes surface 202 of portion 204 of substrate 200, which is surrounded by dielectric shielding layer 222. Accordingly, the lateral dimensions (e.g., width) of patterned trench 612 correspond to the lateral dimensions of portion 204, ranging between about 10 μm and about 50 μm, such as between about 20 μm and about 40 μm.

Figure 6C:
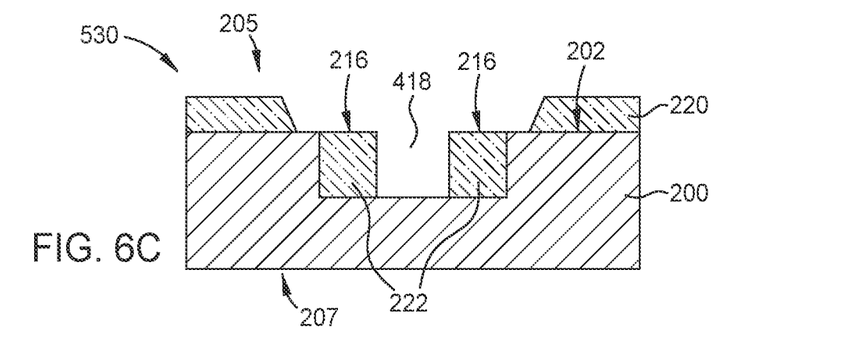

At operation 530 and FIG. 6C, substrate 200 is exposed to a silicon etch process to form hole 418 within dielectric shielding layer 222, and resist film 610 is thereafter removed. In certain embodiments, the silicon etch process at operation 530 is substantially similar to the etch processes at operations 120 and 330. For example, the etch process may be a wet etch process, including a buffered etch process that is selective for the removal of silicon, or an isotropic aqueous etch process. As a result of the silicon etch process, portion 204 of substrate 200 is etched away, forming hole 418 within dielectric shielding layer 222. As described above, hole 418 may have any desired morphology, such as a cylindrical or polygonal morphology. In certain examples, however, hole 418 is ovate or ellipsoid in morphology.

Figure 6D:
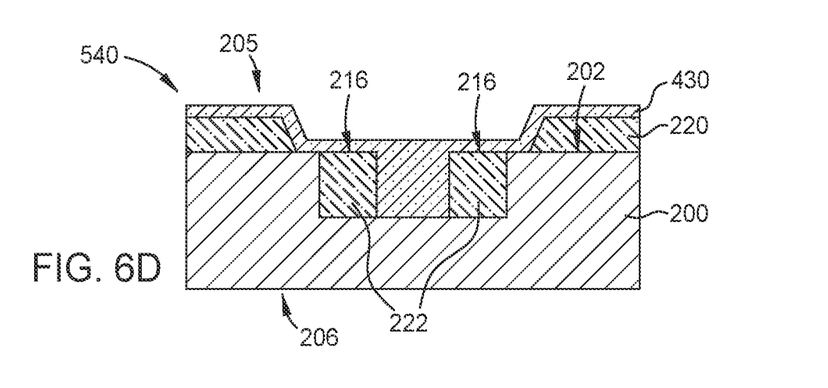

At operation 540 and FIG. 6D, conductive layer 430 is plated over exposed surfaces of dielectric shielding layer 222, dielectric film 220, and surface 202 of substrate 200. As shown in FIG. 6D, a portion of conductive layer 430 extends into hole 418, which will subsequently function as an interconnect through substrate 200. As described above, conductive layer 430 may be deposited over substrate 200 by any suitable methods including electroless deposition or a combination of physical vapor deposition (PVD) and electrochemical deposition (ECD). In certain embodiments, conductive layer 430 is deposited to fill or "plug" hole 418, thus creating a solid or filled conductive body within hole 418. In certain other embodiments, however, conductive layer 430 is deposited to only line surfaces of dielectric shielding layer 222 surrounding hole 418.

Figure 6E:
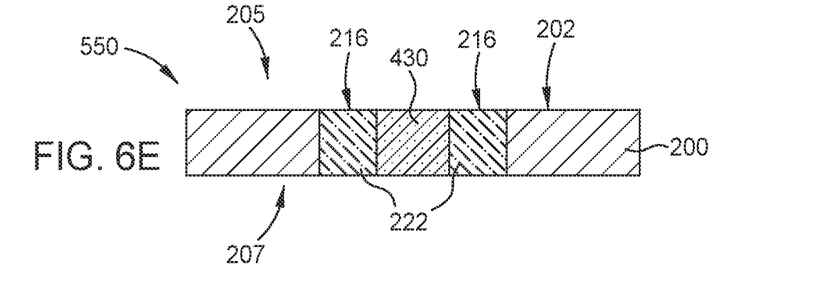

After deposition of conductive layer 430, a grinding or polishing process (e.g., CMP) is performed on substrate 200 at operation 550 and FIG. 6E. The grinding or polishing process removes remaining dielectric film 220 and conductive layer 430 disposed outside of hole 418, as well as a portion of substrate 200 on backside 207 to expose dielectric shielding layer 222 and conductive layer 430 on backside 207. As a result, through-silicon via 440, having conductive layer 430 shielded by dielectric shielding layer 222, is formed.

Figure 7:
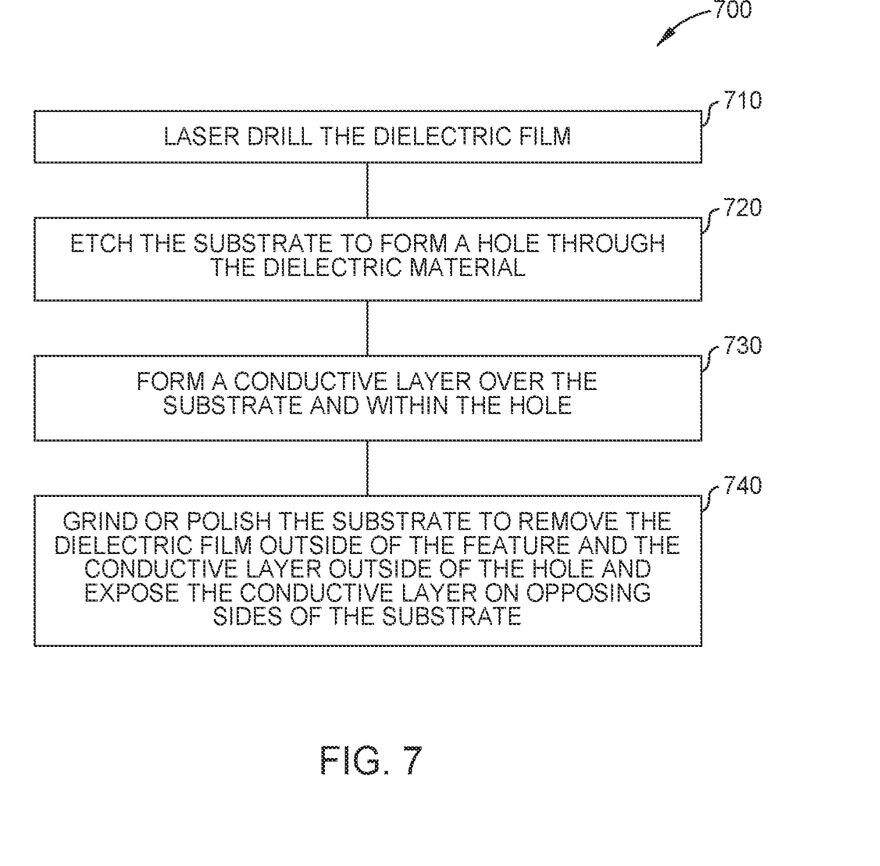
FIG. 7 illustrates a flow diagram of a process for forming a through-silicon via in a substrate, according to embodiments described herein.

FIG. 7 illustrates a flow diagram of another alternative method 700 for forming a through-silicon via in substrate 200 upon performing method 100 described above. FIGS. 8A-8D schematically illustrate cross-sectional views of the substrate 200 at different stages of the through-silicon via formation process 700 represented in FIG. 7. Therefore, FIG. 7 and FIGS. 8A-8D are herein described together for clarity.

Figure 8A:
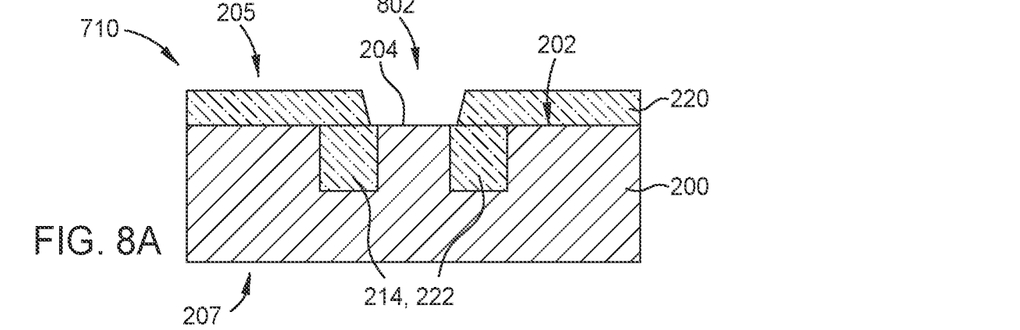
FIGS. 8A-8D schematically illustrate cross-sectional views of a substrate at different stages of the process depicted in FIG. 7.

At operation 710 and FIG. 8A, an area of laminated dielectric film 220 disposed above and corresponding to portion 204 of substrate 200 is removed by laser ablation, thus forming pit 802. Generally, pit 802 is ablated to have outer lateral dimensions at least about the same or greater than portion 204 to enable subsequent removal of portion 204 by etching to form hole 418. The laser system utilized to ablate dielectric film 220 at operation 710 may include any suitable type of laser source, such as an infrared (IR) laser, a picosecond UV, a femtosecond UV laser, or a femtosecond green laser, and may produce a continuous and/or pulsed laser beam.

Figure 8B:
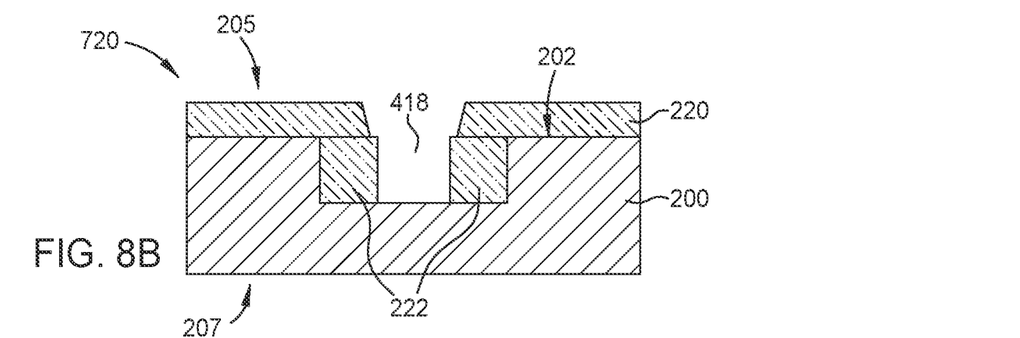

After laser ablation, substrate 200 is exposed to a silicon etch process at operation 720 to etch away portion 204 and form hole 418 through the dielectric material disposed within feature 214. In certain embodiments, the silicon etch process at operation 720 is substantially similar to the etch processes at operations 120, 330, and/or 530. For example, the etch process may be a wet etch process, including a buffered etch process that is selective for the removal of silicon, or an isotropic aqueous etch process. As described above, hole 418 may have any desired morphology, such as a cylindrical or polygonal morphology. In certain examples, however, hole 418 is ovate or ellipsoid in morphology. As depicted in FIG. 8B, the etch process at operation 720 is performed without the use of a resist film. Rather, dielectric layer 220 itself functions as a resist during the process, preventing undesired etching of substrate 200 at locations other than portion 204.

Figure 8C:
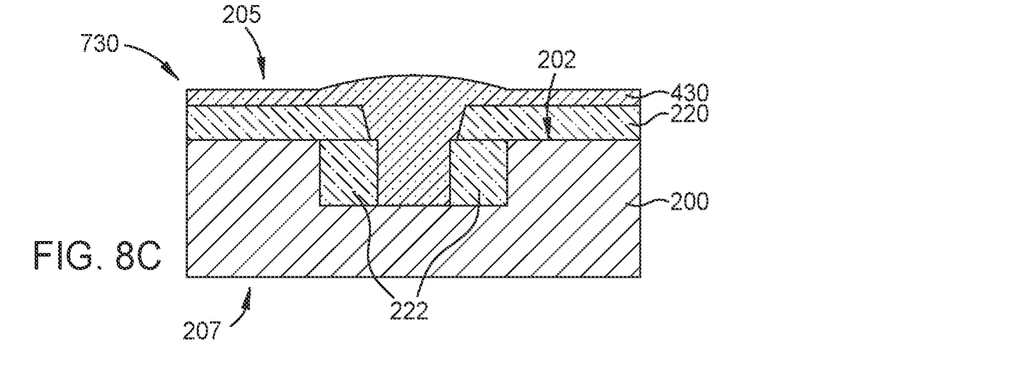

At operation 730 and FIG. 8C, conductive layer 430 is plated over exposed surfaces of dielectric film 220, including a portion of which extends into hole 418 for subsequent use as an interconnection. Conductive layer 430 may be deposited over substrate 200 by any suitable methods including electroless deposition or a combination of physical vapor deposition (PVD) and electrochemical deposition (ECD). In certain embodiments, conductive layer 430 is deposited to fill or "plug" hole 418, thus creating a solid or filled conductive body within hole 418. In certain other embodiments, however, conductive layer 430 is deposited to only line surfaces of the dielectric material surrounding hole 418.

Figure 8D:
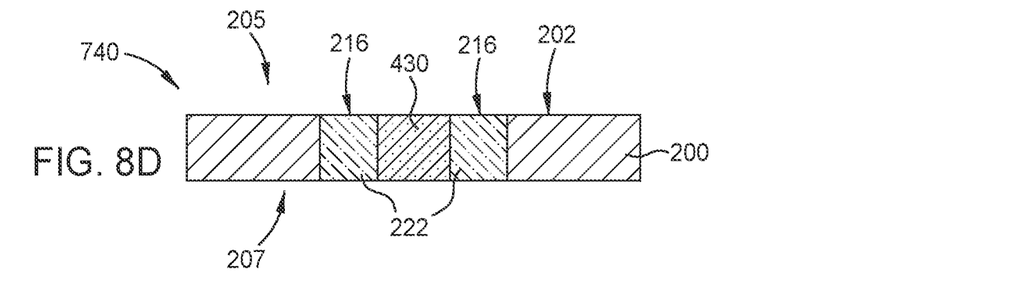

After deposition of conductive layer 430, a grinding or polishing process (e.g., CMP) is performed on substrate 200 at operation 740 and FIG. 8D. The grinding or polishing process removes dielectric film 220 and conductive layer 430 disposed outside of hole 418, as well as a portion of substrate 200 on backside 207 to expose conductive layer 430 on backside 207. As a result, through-silicon via 440, having conductive layer 430 shielded by dielectric shielding layer 222, is formed through substrate 200.

Figure 9:
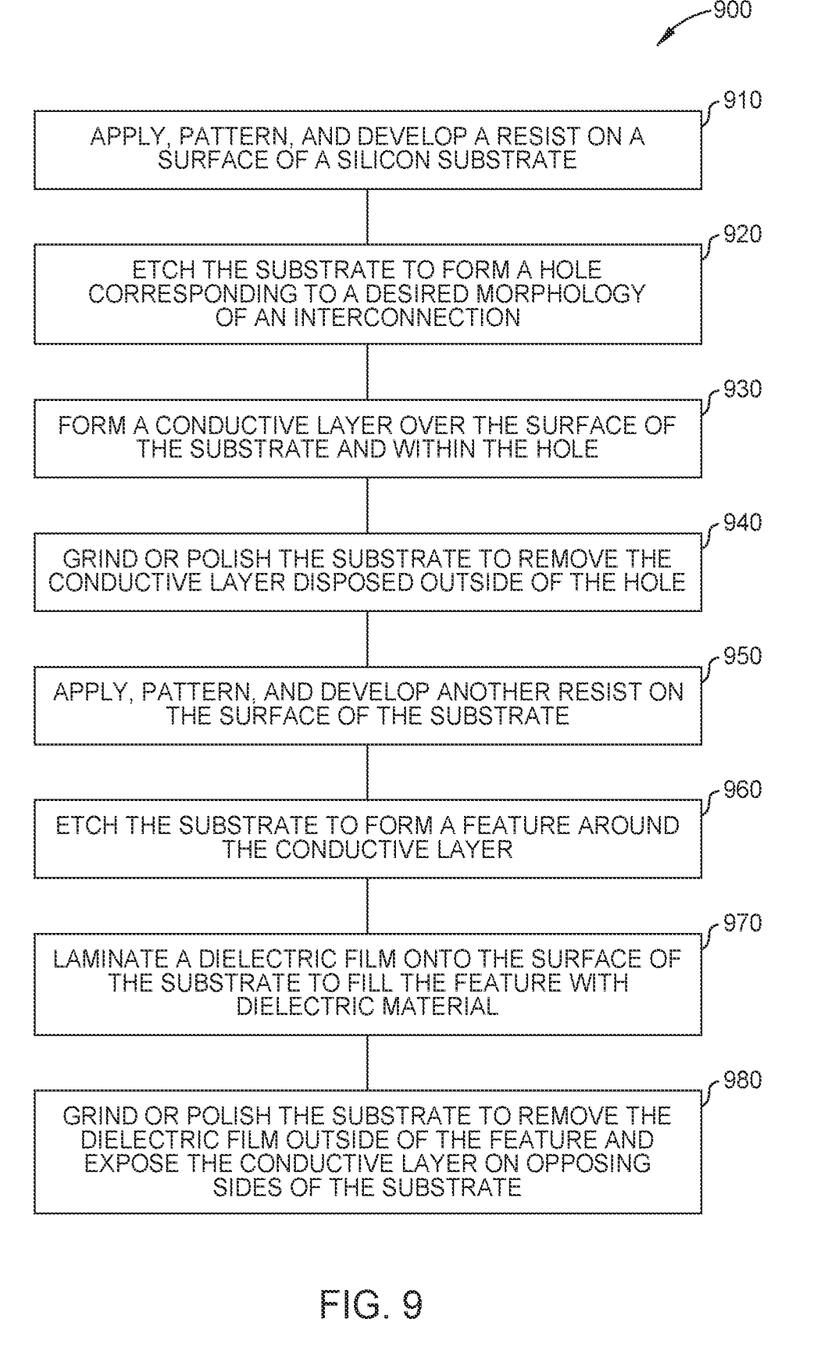
FIG. 9 illustrates a flow diagram of a process for forming a through-silicon via in a substrate, according to embodiments described herein.

FIG. 9 illustrates a flow diagram of another representative method 900 for forming a through-silicon via in substrate 200 independent from the methods 100, 300, 500, and 700 described above. FIGS. 10A-10H schematically illustrate cross-sectional views of a substrate 1000 at different stages of the through-silicon via formation process 900 represented in FIG. 9. Therefore, FIG. 9 and FIGS. 10A-10H are herein described together for clarity.

Generally, method 900 begins at operation 910, corresponding to FIG. 10A, wherein a resist film 1010 is applied to surface 202 on topside 205 of substrate 200 and is subsequently patterned and developed. Resist film 1010 may be substantially similar to resist films 210, 410, and 610, and may be patterned via selective exposure to UV radiation and thereafter developed via a wet process. In further embodiments, an adhesion promoter layer (not shown) may be utilized to promote adhesion of resist film 1010 onto substrate 200.

Figure 10A:
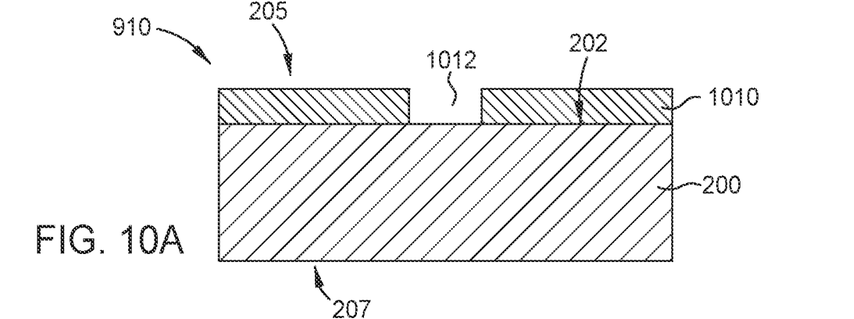
FIGS. 10A-10H schematically illustrate cross-sectional views of a substrate at different stages of the process depicted in FIG. 5.

As depicted in FIG. 10A, resist film 1010 is patterned and developed according to a desired morphology of a subsequently formed interconnection for a through-silicon via. Generally, the subsequently formed interconnection has a cylindrical or round tubular shape, and thus, resist film 1010 is patterned and developed to form a cylindrical trench 1012, enabling the subsequent formation of a round tubular or cylindrical interconnection. However, in certain embodiments, a non-cylindrical or non-annular interconnection is desired, and accordingly, a non-round or non-cylindrical trench 1012 is formed.

Figure 10B:
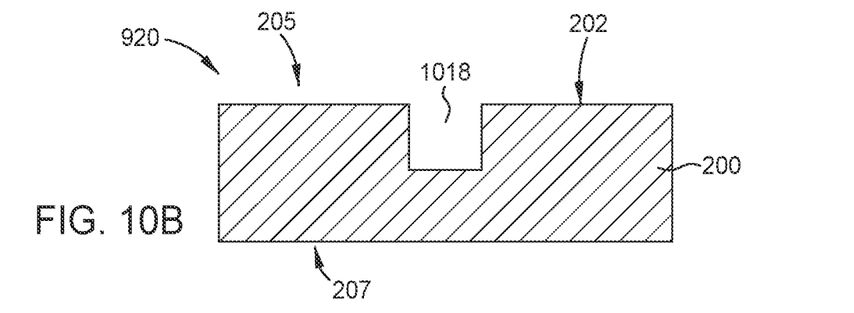

At operation 920, substrate 200, now having patterned and developed resist film 1010 formed thereon, is exposed to a silicon etch process to transfer the pattern of resist film 1010 to substrate 200, and resist film 1010 is thereafter removed. In certain embodiments, the silicon etch process at operation 920 is substantially similar to the etch processes at operations 120, 330, 530, and/or 720. For example, the etch process may be a wet etch process, including a buffered etch process that is selective for the removal of silicon, or an isotropic aqueous etch process.

As a result of the etch process, portions of substrate 200 exposed through trench 1012 are etched away, forming a hole 1018 which substantially corresponds in lateral morphology to trench 1012 and thus, the subsequently formed interconnection. For example, in certain embodiments, hole 1018 may be substantially cylindrical in shape with a diameter similar to trench 1012. Generally, the depth of hole 1018 may be modulated by controlling the time of exposure of substrate 200 to the etchants (e.g., the etching solution) used during the etch process. For example, a final depth of hole 1018 may be increased with increased exposure to the etchants. Alternatively, hole 1018 may have a decreased (e.g., shallower) final depth with decreased exposure to the etchants.

Figure 10C:
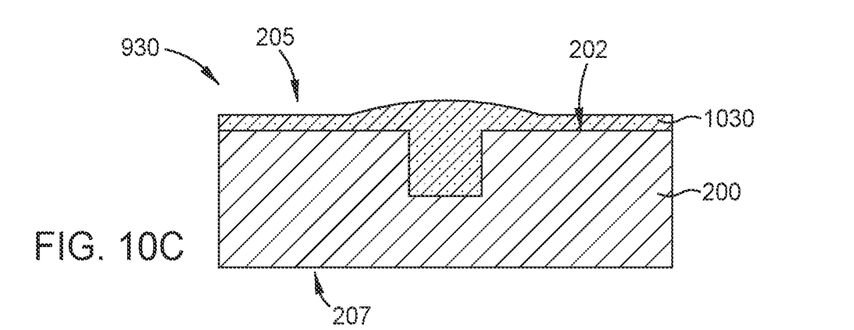

At operation 930 and FIG. 10C, conductive layer 1030 is plated over topside 205 of substrate 200, including surface 202 and surfaces extending into hole 1018 for subsequent use as an interconnection. Conductive layer 1030 is substantially similar to conductive layer 430 and may be deposited over substrate 200 by any suitable methods including electroless deposition or a combination of physical vapor deposition (PVD) and electrochemical deposition (ECD). In certain embodiments, conductive layer 1030 is deposited to fill or "plug" hole 1018, thus creating a solid or filled conductive body within hole 1018. In certain other embodiments, however, conductive layer 1030 is deposited to only line surfaces of substrate 200 surrounding hole 1018.

Figure 10D:
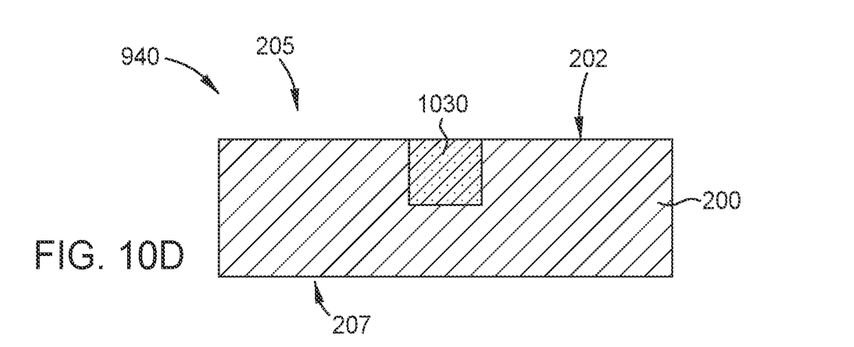

After deposition of conductive layer 1030, a grinding or polishing process (e.g., CMP) is performed on substrate 200 at operation 940 and FIG. 10D. The grinding or polishing process removes conductive layer 1030 disposed outside of hole 1018, thus forming a top surface 1026 of conductive layer 1030 that is planar with surface 202 of substrate 200.

At operation 950 and FIG. 10E, a second resist film 1050 is applied to surface 202 of substrate 200 and is subsequently patterned and developed. Resist film 1050 may be substantially similar to resist film 1010, and may be patterned via selective exposure to UV radiation and thereafter developed via a wet process. In further embodiments, an adhesion promoter layer (not shown) may be applied to surface 202 of substrate 200 prior to application of resist film 1050, such as an adhesion promoter layer formed of bis(trimethylsilyl) amine, hexamethyldisilazane (HMDS), propylene glycol monomethyl ether acetate (PGMEA), and the like.

Figure 10E:
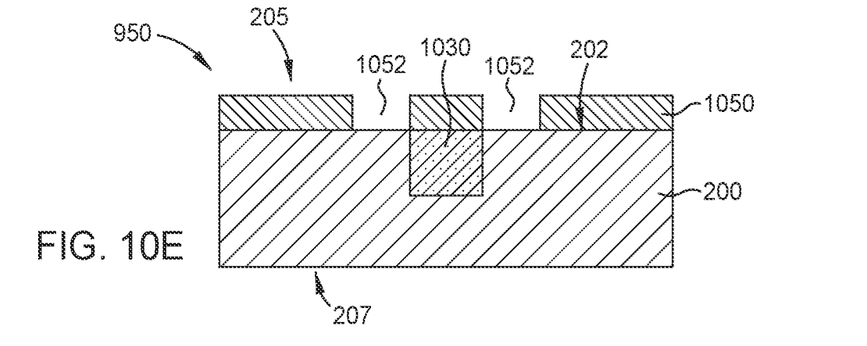

As depicted in FIG. 10E, resist film 1050 is patterned and developed to form a trench 1052 that corresponds to a desired morphology of a subsequently formed dielectric shielding layer for conductive layer 1030. Accordingly, formation of trench 1052 exposes surface 202 of substrate 200 around hole 1018. Generally, the subsequently formed dielectric shielding layer has a round tubular shape, and so trench 1052 is patterned to be annular. However, in certain embodiments, a non-cylindrical or non-annular interconnection and/or non-annular dielectric shielding layer is desired, and thus, a non-annular trench 1052 is formed. For example, trench 1052 formed in resist film 1050 may be ovate, ellipsoid, or polygonal in shape.

Figure 10F:
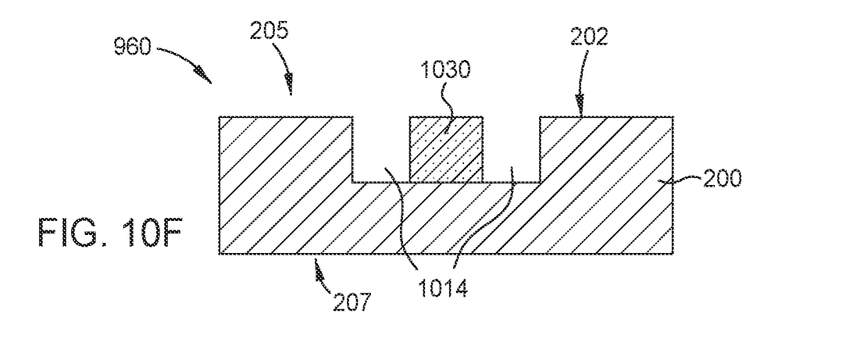

After patterning and developing resist film 1050, substrate 200 is exposed to a second silicon etch process at operation 960 to transfer the pattern of resist film 1050 to substrate 200, and resist film 1050 is thereafter removed. Similar to the etch processes described above, the etch process at operation 960 may be a wet etch process, including a buffered etch process that is selective for the removal of silicon, or an isotropic aqueous etch process. As shown in FIG. 10F, portions of substrate 200 exposed through trench 1052 are etched away at operation 960, forming a feature 1014 which substantially corresponds in lateral morphology to trench 1052 and thus, the subsequently formed dielectric shielding layer. For example, in certain embodiments, feature 1014 may be substantially annular in shape and circumferentially surround conductive layer 1030.

Figure 10G:
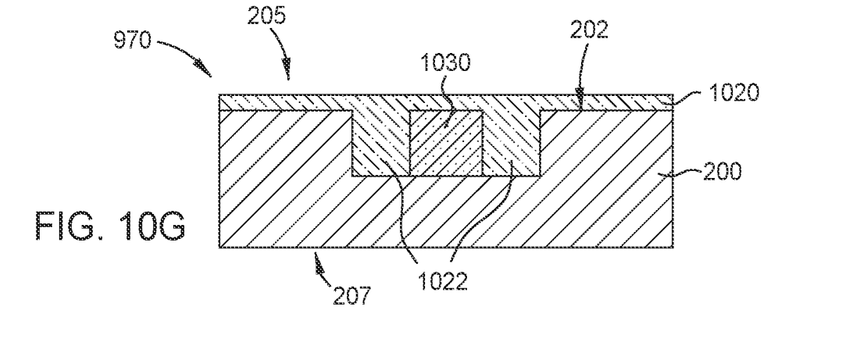

At operation 970 and FIG. 10G, a dielectric film 1020 is placed over surface 202 of patterned substrate 200 and laminated to flow into and fill newly-formed feature 1014. During lamination, substrate 200 and dielectric film 1020 are exposed to elevated temperatures, causing dielectric film 1020 to soften and flow into feature 1014. In certain embodiments, the lamination process is a vacuum lamination process that may be performed in an autoclave or other suitable device. In certain embodiments, the lamination process is performed by use of a hot pressing process.

Figure 10H:
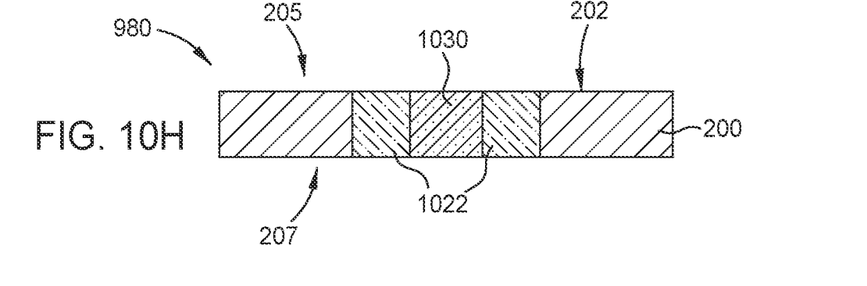

Finally, at operation 980 and FIG. 10H, a second grinding or polishing process (e.g., CMP) is performed on substrate 200 to remove dielectric film 1020 disposed outside of feature 1014, as well as a portion of substrate 200 on a backside 207 thereof. Similar to the grinding or polishing processes described above, the grinding or polishing on topside 205 may stop at surface 202 of substrate 200, while the grinding or polishing on backside 207 is carried out until conductive layer 1030 is exposed on backside 207. As a result, a through-silicon via 1040 is formed having conductive layer 1030 (e.g., interconnection) shielded by a dielectric shielding layer 1022.

The methods and through-via structures described above provide many advantages over methods and architectures implementing conventional dielectric material deposition techniques for shielding of package interconnections. Such benefits include the capability of forming high-thickness dielectric shielding layers while maintaining low aspect ratios of through-via structures. Furthermore, the aforementioned features, in addition to the thin form factor and high via-to-substrate volume ratios of the resulting package structures, advantageously provide packaging architectures for advanced integrated semiconductor devices with improved performance and flexibility, and relatively low manufacturing costs as compared to conventional packaging technologies. The thin and small-form-factor package structures described herein provide the benefits of not only high I/O density and improved bandwidth and power, but also maximized shielding effectiveness against unwanted leakage current or interference.

While the foregoing is directed to embodiments of the present disclosure, other and further embodiments of the disclosure may be devised without departing from the basic scope thereof, and the scope thereof is determined by the claims that follow.

The invention claimed is:

1. A method of forming a through-silicon via structure, comprising:
    applying and patterning a first resist film on a first side of a silicon substrate;
    etching the silicon substrate through the patterned first resist film to form a hole in the first side;
    plating a conductive material over the first side of the silicon substrate, the conductive material extending through the hole;
    grinding or polishing the first side of the silicon substrate, wherein the grinding or polishing removes the conductive material disposed outside of the hole;
    applying and patterning a second resist film on the first side of the silicon substrate;
    etching the silicon substrate through the patterned second resist film to form a trench in the first side, the trench surrounding the hole having the conductive material extending therethrough;
    laminating a dielectric film onto the first side of the silicon substrate, the lamination of the dielectric film causing a dielectric material of the dielectric film to fill the trench; and
    grinding or polishing the first side of the silicon substrate and a second side opposite the first side, wherein the grinding or polishing removes the dielectric film disposed outside of the trench, and wherein the grinding or polishing further exposes the conductive material and the dielectric material on the first side and the second side.

2. The method of claim 1, wherein the trench has an annular shape.

3. The method of claim 1, wherein the dielectric material comprises an epoxy resin having a ceramic filler.

4. The method of claim 3, wherein the ceramic filler comprises one or more of aluminum nitride (AlN), aluminum oxide ($Al_2O_3$), silicon carbide (SiC), silicon nitride ($Si_3N_4$), $Sr_2Ce_2Ti_5O_{16}$ ceramics, zirconium silicate ($ZrSiO_4$), wollastonite ($CaSiO_3$), beryllium oxide (BeO), cerium dioxide ($CeO_2$), boron nitride (BN), calcium copper titanium oxide ($CaCu_3Ti_4O_{12}$), magnesium oxide (MgO), titanium dioxide ($TiO_2$), and zinc oxide (ZnO).

5. The method of claim 1, wherein the conductive material is plated via electroless plating, or physical vapor deposition (PVD) and electrochemical deposition (ECD).

6. The method of claim 5, wherein the conductive material comprises at least one of copper, aluminum, gold, nickel, silver, palladium, and tin.

* * * * *